(12) United States Patent
Glasper et al.

(10) Patent No.: US 7,271,376 B2
(45) Date of Patent: Sep. 18, 2007

(54) AVALANCHE PHOTODIODE WITH REDUCED SIDEWALL DEFECTS

(75) Inventors: John L Glasper, Malvern (GB); David J Robbins, Malvern (GB); Weng Y Leong, Worcester (GB)

(73) Assignee: QinetiQ Limited, London (GB)

(*) Notice: Subject to any disclaimer, the term of this patent is extended or adjusted under 35 U.S.C. 154(b) by 194 days.

(21) Appl. No.: 10/520,850
(22) PCT Filed: Jul. 3, 2003
(86) PCT No.: PCT/GB03/02865
§ 371 (c)(1), (2), (4) Date: Jan. 11, 2005
(87) PCT Pub. No.: WO2004/008549
PCT Pub. Date: Jan. 22, 2004

(65) Prior Publication Data
US 2005/0258340 A1 Nov. 24, 2005

(30) Foreign Application Priority Data
Jul. 11, 2002 (GB) ................. 0216069.5

(51) Int. Cl.
H01L 31/072 (2006.01)
H01L 31/107 (2006.01)
(52) U.S. Cl. ................. 250/208.1; 257/438; 257/446; 257/461
(58) Field of Classification Search ................. 257/452, 257/438, 446, 186, 458, 461; 250/208.1, 250/214.1
See application file for complete search history.

(56) References Cited

U.S. PATENT DOCUMENTS
4,127,932 A    12/1978  Hartman et al.
(Continued)

FOREIGN PATENT DOCUMENTS
EP   0 540 235   5/1993
(Continued)

OTHER PUBLICATIONS
Patent Abstracts of Japan, vol. 0080, No. 78, Apr. 1984, JP 58-223382.
(Continued)

Primary Examiner—Thanh X. Luu
Assistant Examiner—Tony Ko
(74) Attorney, Agent, or Firm—Nixon & Vanderhye P.C.

(57) ABSTRACT

A photodetector circuit incorporates an avalanche photodiode structure having a contact layer (14) forming an ohmic contact over an annular region (18) with the annular guard ring (8). In the fabrication process, the starting substrate can either be the handle wafer of a p– silicon-on-insulator wafer, or a p-Si substrate with an insulating $SiO_2$ layer (4). A window (6) is produced in the insulating layer (4) by conventional photolithographic and etching. A n+ guard ring (8) is created by diffusing donor impurities into the substrate, and a thinner insulating $SiO_2$ layer (22) is thermally grown so as to cover the exposed surface of the substrate within the window (6). P-type dopant is then implanted through the thin oxide layer to increase the doping level near the surface of the substrate. Subsequently a second window (24) is made in the insulating layer (22), and the layer (12) is then epitaxially grown selectively on the area of the substrate exposed by the window (24) in the insulating layer (22). The use of the thin oxide layer (22) reduces the area of the interface between the silicon of the layer (12) and the $SiO_2$ of the layer (22) during the selective epitaxial deposition, thus leading to a reduction in the detrimental effect of the thermal expansion coefficient mismatch and producing less epitaxial defects at the window edge. After the epitaxial layer (12) has been grown the remaining part of the insulating layer (22) is removed by wet oxide etch which exposes an annular portion (26) of the underlying guard ring (8). Subsequently a n+ silicon epi-poly layer (14) is deposited on the surface of the device, and forms an ohmic contact with the guard ring (8), and simultaneously forms the top contact of the photodiode. Such a fabrication process does not significantly increase the fabrication complexity. Although an additional mask is required as compared with the conventional fabrication process, the fact that the layer (14) is in ohmic contact with the guard ring (8) means that it is no longer necessary to provide a separate contact to the guard ring, and as a result the overall number of masks or process steps used may be similar in both processes.

23 Claims, 3 Drawing Sheets

U.S. PATENT DOCUMENTS

| | | |
|---|---|---|
| 4,442,444 A | 4/1984 | Osaka |
| 4,491,802 A | 1/1985 | Uchida et al. |
| 4,689,305 A | 8/1987 | Stiffey et al. |
| 5,144,381 A | 9/1992 | Furuyama et al. |
| 5,198,380 A * | 3/1993 | Harari ..................... 438/257 |
| 5,236,871 A | 8/1993 | Fossum et al. |
| 5,354,707 A | 10/1994 | Chapple-Sokol et al. |
| 5,483,200 A | 1/1996 | Okabayashi et al. |
| 5,596,186 A | 1/1997 | Kobayashi |
| 5,621,227 A | 4/1997 | Joshi |
| 5,783,839 A | 7/1998 | Morikawa et al. |
| 5,796,118 A | 8/1998 | Morikawa et al. |
| 6,005,266 A | 12/1999 | Forrest et al. |
| 6,043,517 A | 3/2000 | Presting et al. |
| 6,100,551 A | 8/2000 | Lee et al. |
| 6,107,619 A | 8/2000 | Cunningham et al. |
| 6,392,282 B1 | 5/2002 | Sahara et al. |
| 6,407,442 B2 | 6/2002 | Inoue et al. |
| 6,417,504 B1 | 7/2002 | Kozlowski |
| 6,858,912 B2 * | 2/2005 | Marshall .................... 257/438 |
| 2001/0002045 A1 | 5/2001 | Fossum et al. |
| 2002/0024058 A1 | 2/2002 | Birch et al. |

FOREIGN PATENT DOCUMENTS

| | | |
|---|---|---|
| EP | 0 967 656 | 12/1999 |
| EP | 1 220 325 | 7/2002 |
| GB | 2 202 624 | 9/1988 |
| JP | 60116182 | 6/1985 |
| JP | 55091184 | 4/1993 |
| JP | 10-190041 | 7/1998 |

OTHER PUBLICATIONS

J. Huppertz et al, "Fast CMOS Imaging With High Dynamic Range" Proc. 1997 IEEE Workshop on Charge-Coupled Devices and Advanced Image Sensors.

E. Fossum, "Image Capture Circuits in CMOS" 1997 International Symposium on VLSI Technology, Systems, and Applications.

N. Tu et al, "CMOS Active Pixel Image Sensor With Combined Linear and Logarithmic Mode Operation" Electrical and Computer Engineering, 1998, pp. 754-757.

T. Delbruck et al, "Adaptive Photoreceptor With Wide Dynamic Range" Circuits and Systems, 1994, pp. 339-342.

S.M. Sze VLSI Technology pp. 482-485.

Spinelli et al IEEE Transactions on Electron Devices, vol. 44, No. 11, Nov. 1997 pp. 1931-1943 Physics and Numerical Simulation of Single Photon Avalanche Diodes.

Jackson et al Proc. IEEE 2001 Int. Conference on Microelectronic Test Structures, vol. 14, Mar. 2001 pp. 165-170 Process Monitoring and Defect Characterization of Single Photon Avalanche Diodes.

* cited by examiner

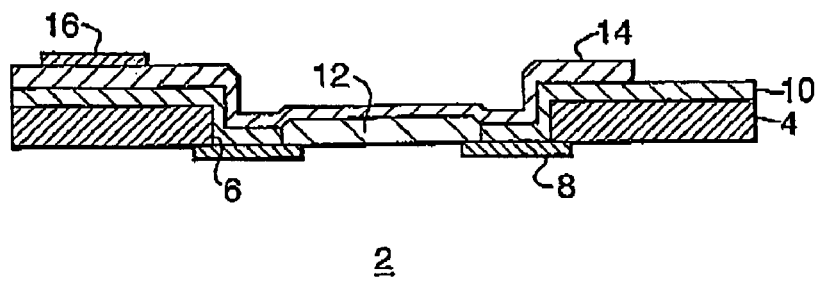
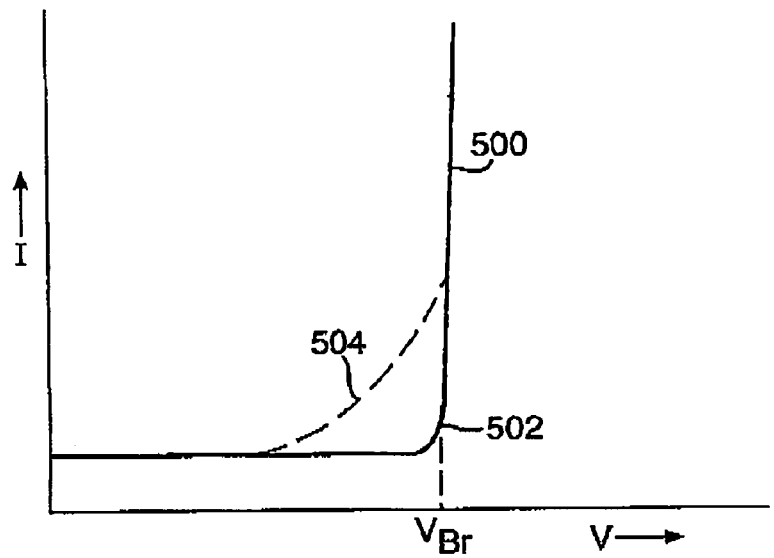
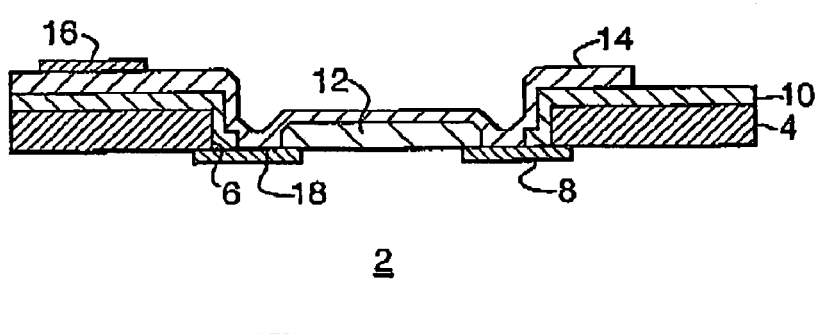

AVALANCHE PHOTODIODE WITH REDUCED SIDEWALL DEFECTS

This application is the US national phase of international application PCT/GB2003/002865, filed in English on 3 Jul. 2003, which designated the US. PCT/GB2003/002865 claims priority to GB Application No. 0216069.5 filed 11 Jul. 2002. The entire contents of these applications are incorporated herein by reference.

This invention relates to photodetector circuits incorporating photodiode detectors, and to methods of making such circuits and arrays incorporating such circuits.

There is a long-felt want for a photodetector circuit suitable for a solid state imaging system or camera operative under daytime and night-time conditions. Such a circuit should be capable of imaging in illuminating radiation intensities extending from direct sunlight down to sub-twilight, that is its illumination sensitivity should preferably extend over eight decades, or approach this range as nearly as possible, although not necessarily in a single operating mode. Its simultaneous dynamic range of illumination sensitivity, that is its illumination sensitivity in any one mode of operation, should preferably be at least four, and possibly six, decades, although for some applications, such as sub-twilight imaging, two or three decades of sensitivity would be adequate.

Another important consideration is whether or not a photodetector circuit is suitable for replication to provide an array of pixel circuits. This requires the circuits to be physically small, implementable as integrated circuits, and to have properties which are either accurately reproducible or adjustable to produce like properties. Discrete components such as operational amplifiers are too large to be incorporated in individual pixel circuits for large pixel arrays.

Existing technology cannot meet these objectives satisfactorily. Although photodetectors are known which consist of arrays of charge-coupled devices (CCDs) providing reasonable sensitivity to twilight levels of illumination if detector signals are integrated for longer than is normal, CCD camera images bloom and go into saturation (loss of image contrast) at high illuminating radiation intensities. Furthermore such photodetectors have poor simultaneous dynamic range (two or three decades) and consequently cannot resolve image features in both sunlight and shadow simultaneously, that is within the same image frame. In Proc SPIE pp. 19-29, Vol. 2172, "Charge Coupled Devices and Solid State Optical Sensors IV", January 1994, Mendis et al. discloses cameras with detectors in the form of arrays of silicon p-n diodes on complementary metal oxide/silicon-on-silicon substrates (CMOS-on-Si). Such detectors have performance similar to that of CCDs, i.e. with the same limitations on simultaneous dynamic range in particular, but they make it possible to operate at lower power consumption than a CCD array of comparable resolution.

In Proc Advanced Focal Plane Arrays and Electronic Cameras 1996, "Random Addressable Active Pixel Image Sensors", Dierickx et al. discloses logarithmic CMOS imaging systems with photodiode detectors dealing with the dynamic range problem. These have a very high simultaneous dynamic range of up to six decades which allows imaging from twilight to direct sunlight. Unfortunately they are characterised by thermal noise and unwanted artefacts arising from mismatch of pixel circuit elements (MOSFETs) too severe to achieve imaging significantly below twilight. Some systems of this kind also have a bandwidth that is dependent on illumination level, thus causing the response to slow at low illuminating radiation intensities.

An avalanche photodiode (APD) detector array has been investigated for use in imaging systems by A. Biber and P. Seitz, and is reported in the Proceedings of the IS&T/SPIE Conference on Sensors, Cameras and Systems for Scientific/Industrial Applications, California 1999, pp. 40-49. This reference discloses APDs produced using Si-CMOS technology (implantation or diffusion) and biased into a sub-Geiger mode of operation. Unfortunately it has been found that it is difficult to produce APD detector arrays in which the APDs are sufficiently small and uniform to provide acceptable resolution and image quality.

US Published Application No. 2002/0024058A1, now U.S. Pat. No. 6,858,912, discloses a photodetector circuit including a photodiode detector and associated readout CMOS circuitry, in which an active region of the photodiode detector is formed by at least one epitaxial layer, and a guard ring is provided to delimit the photodiode detector in order to enhance electrical field uniformity and inhibit premature breakdown. The provision of the epitaxial layer provides a number of improvements in photodiode characteristics combined with the low cost of CMOS technology, whilst the guard ring reduces the scope for localised high electric fields and improves breakdown characteristics. The CMOS component may be a substrate and CMOS circuitry supported by and insulated from the substrate, and the photodiode detector may be operable in a current multiplication mode and comprise at least one region epitaxially deposited upon the substrate. The photodiode detector may be a PIN structure, or an avalanche photodiode comprising a first region of one conductivity type incorporated in the substrate, a second region of opposite conductivity type being provided by the epitaxial layer.

FIG. 1A is a graph of current against voltage for a reverse-biased avalanche photodiode manufactured by a CMOS process. The curve 500 has a sharp knee 502 ending at a voltage $V_{Br}$ at which breakdown occurs. An avalanche photodiode required to operate in a sub-Geiger mode operates at a voltage $V_{Op}$ lower than $V_{Br}$ but sufficiently close to $V_{Br}$ for current multiplication to occur, that is so that $V_{Op}$ is on the knee 502 but below $V_{Br}$. This leads to a problem when it is required to make an array of pixel circuits each using sub-Geiger current multiplication in that $V_{Br}$ will differ for different avalanche diodes due to differences in construction and doping within manufacturing tolerances. As a result, under a common reverse bias voltage; the avalanche photodiodes in the array will all have different voltages relative to their respective $V_{Br}$, that is ($V_{Br}-V_{Op}$) will vary across the array, so that the current multiplication provided by the photodiodes will vary across the array, since multiplication increases with proximity of $V_{Op}$ to $V_{Br}$. This is a problem because the sharpness of the knee 502 means that $V_{Op}$ must be very close to $V_{Br}$ to achieve the required current multiplication, and a variation in $V_{Br}$ makes a constant degree of current multiplication very difficult to achieve reliably in pixels of an array.

However it has been found that avalanche diodes produced by an epitaxial process as disclosed in US 2002/0024058A1 do not exhibit such a sharp knee. Instead they tend to exhibit a knee as indicated schematically by the chain line of 504 in FIG. 1A so that the rate of change of current with respect to voltage dI/dV is much more gradual than at the knee 502. As a result variation in the voltage difference ($V_{Br}-V_{Op}$) across an array incorporating such avalanche photodiodes will have a much lesser effect on the constancy of the current multiplication across the array than in the case of the array described above incorporating avalanche photodiodes manufactured by a CMOS process.

FIG. 1 shows the structure of an avalanche photodiode produced by an epitaxial process as described in US 2002/0024058A1 fabricated on a lightly doped (p−) silicon substrate 2 bearing an insulating $SiO_2$ layer 4. A CMOS process may be used to produce silicon readout circuitry (not shown) on top of the insulating layer 4. To form the avalanche photodiode a circular window 6 is provided in the insulating layer 4, and an n+ annular guard ring 8 is created by diffusing (or implanting and diffusing) donor impurities into the substrate 2. An amorphous second $SiO_2$ insulating layer 10 is deposited after creation of the guard ring 8 so as to cover the CMOS circuitry and the guard ring 8.

A substantially undoped or lightly doped (uniform or graded, p-type or n-type) epitaxial Si or SiGe layer 12 is provided within the window 6, having been grown on a central portion of the substrate 2 within the window 6 exposed by etching a second window in the second insulating layer 10. A heavily n-doped (n+) epi-poly layer 14 is provided as a contact layer on top of the active layer 12, with a metal contact 16 being provided on top of the layer 14. The high field region (and therefore the current multiplication) occur within the epitaxial layer 12. The device thereby acts as a form of a p-i-n photodiode. The epitaxial process allows the layer thickness to be controlled accurately and the layer composition to be varied, thus allowing the photodiode breakdown voltage to be suitably tailored.

One difficulty encountered with such an avalanche photodiode structure is that sidewall defects are formed at the edges of the second window (i.e. at the edges of layer 10 where it meets epitaxial layer 12) during epitaxial growth of the active and contact layers 12, 14. These defects lie within the depletion region of the PN junction of the photodiode leading to high leakage current. It is considered that such sidewall defects are caused by the mismatch in the thermal expansion coefficients of $SiO_2$. Sherman et al., "Elimination of the Sidewall Defects in Selective Epitaxial Growth (SEG) of Si for a Dielectric Isolation Technology", IEEE Electron Device Lett., Vol. 17, No. 6, p 267-269 (1996) shows that a nitridated oxide surface minimises the sidewall defect formation during selective Si epitaxy in oxide windows as the oxynitride surface has a thermal expansion coefficient closer to Si. However the nitridation step is a high temperature process which may not be readily incorporated in a low thermal budget process flow. A further difficulty is that it cannot be guaranteed that the guard ring 8 is at the same bias as the contact layer 14 during device operation. If it is desired that the guard ring 8 be held at the same bias voltage as the contact layer 14 then it is necessary to make a separate contact directly to the guard ring 8.

It is an object of the invention to provide improvements in such photodetector circuits.

According to the present invention there is provided a method of making a photodiode in a window formed in an electrically isolated layer, the method including the steps of providing a first electrically insulating layer on a semiconductor substrate, forming a first window in the first insulating layer exposing an area of the substrate within the first window, forming a guard ring in the exposed area of the substrate within the first window, providing a second electrically insulating layer covering the exposed area of the substrate within the first window, forming a second window in the second insulating layer exposing a selected area of the substrate within the first window, and growing on the selected area of the substrate exposed by the second window an epitaxial layer providing an active region of the photodiode such that the edges of the epitaxial layer are spaced from the inner periphery of the first window.

Such a method overcomes a number of the difficulties encountered with conventional methods in that a much thinner oxide layer, typically about 25 nm, is used to define the extent of the grown epitaxial layer, and this reduces the area of the interface responsible for the production of the sidewall defects during epitaxial deposition. Thus the detrimental effect of the thermal expansion coefficient mismatch is reduced leading to a reduction in defects at the window edge, and thereby lowering the leakage current of the photodiode.

The invention also provides a photodetector circuit including a photodiode, the circuit comprising a semiconductor substrate, a first electrically insulating layer on the substrate, a first window in the first insulating layer, a guard ring in the substrate within the first window, a second electrically insulating layer on the first insulating layer, a second window in the second insulating layer within the first window, and an epitaxial layer on the substrate forming an active region of the photodiode, the epitaxial layer being located within the second window such that the edges of the epitaxial layer are spaced from the inner periphery of the first window.

In order that the invention may be more fully understood, a preferred embodiment of the invention will now be described, by way of example, with reference to the accompanying drawings, in which:

FIG. 1 (Prior Art) is an explanatory sectional view of the structure of a known avalanche photodiode;

FIG. 1A is a graph of current against voltage in an avalanche photodiode;

FIG. 2 is an explanatory sectional view of the structure of a avalanche photodiode used in the preferred embodiment of the invention;

FIG. 2 shows the structure of the avalanche photodiode used in a preferred embodiment of a photodetector circuit in accordance with the invention showing the difference in the structure as compared with the conventional avalanche photodiode structure shown in FIG. 1. It will be seen that, in the improved structure of FIG. 2, the contact layer 14 forms an ohmic contact over an annular region 18 with the annular guard ring 8. The improved structure also suffers from less sidewall defect formation during the epitaxial growth process which would otherwise lead to high leakage current within the depletion region of the PN junction, as will be more clearly appreciated from the following description of the method of fabrication of the improved avalanche photodiode given with reference to FIGS. 3 to 6 below.

Figure 3:
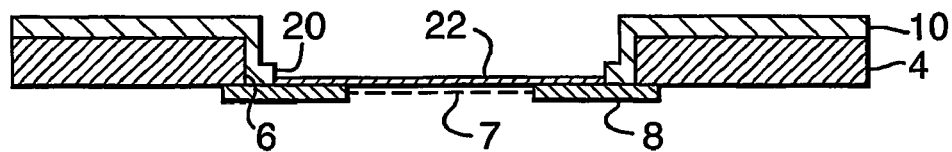
FIGS. 3 to 6 are explanatory sectional views of successive steps in the fabrication of the avalanche photodiode of FIG. 2.

As in the prior art avalanche photodiode fabrication process, the starting substrate can either be the handle wafer of a p− silicon-on-insulator wafer, or an electrically isolated p-type well in a Si substrate with an insulating $SiO_2$ layer 4. A window 6 is produced in the insulating layer 4 by conventional photolithographic and etching. A n+ guard ring 8 is created by diffusing donor impurities into the substrate, and subsequently an amorphous further $SiO_2$ insulating layer 10 is deposited on the device surface. A further, smaller window 20 is then made in the insulating layer 10 by conventional photolithography and etching, and a thinner insulating $SiO_2$ layer 22, typically of about 25 nm thickness, is thermally grown or deposited so as to cover the exposed surface of the substrate within the window 20, as shown in FIG. 3. As shown by broken lines 7, P-type dopant (e.g boron) is then optionally implanted through the thin oxide layer to increase the doping level near the surface of the substrate within the guard ring 8. Together with the thickness of the epitaxial layer, this doping forms the adjustment of the breakdown characteristic of the device. Subsequently a window 24 is made in the insulating layer 22 by conventional photolithography and etching, as shown in FIG. 4.

Figure 4:
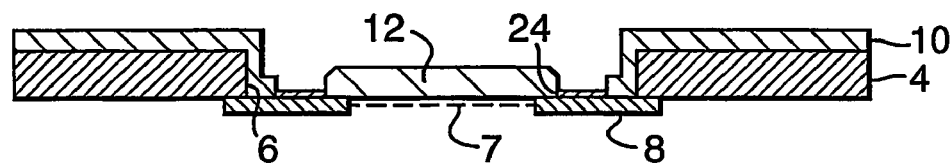

The substantially undoped or lightly doped (uniform or graded) epitaxial Si or SiGe layer 12 is then epitaxially grown selectively on the area of the substrate exposed by the window 24 in the insulating layer 22, as shown in FIG. 4. The use of the thin oxide layer 22 reduces the area of the interface between the silicon of the layer 12 and the $SiO_2$ of the layer 22 during the selective epitaxial deposition, thus leading to a reduction in the detrimental effect of the thermal expansion coefficient mismatch and producing less epitaxial defects at the window edge.

Figure 5:
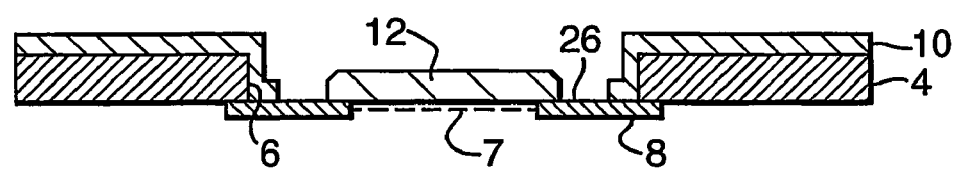
Figure 6:
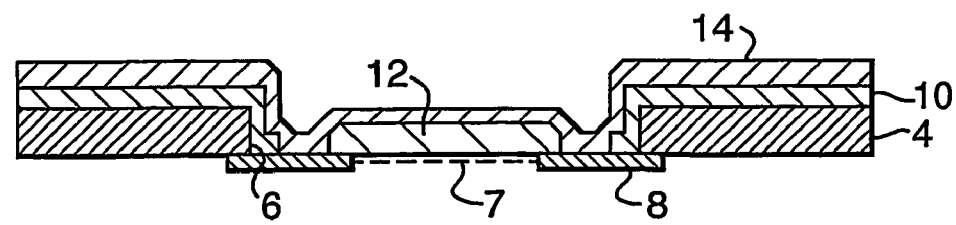

After the epitaxial layer 12 has been grown the remaining part of the insulating layer 22 is removed by a wet oxide etch (e.g. an HF dip) which exposes an annular portion 26 of the underlying guard ring 8, as shown in FIG. 5. It will be noted that the epitaxial layer 12 is spaced from the inner periphery of the window 6 (and the further window 20) by the selective epitaxial growth and this etching step. Subsequently a n+ silicon epi-poly layer 14 is deposited on the surface of the device, and forms an ohmic contact with the guard ring 8, as shown in FIG. 6, and simultaneously forms the top contact of the photodiode. The epi-poly layer 14 is substantially epitaxial where it overlies the epitaxial layer 12 and the portion 26 of the guard ring 8, and is substantially polycrystalline where it overlies the insulating layer 10.

Such a fabrication process does not significantly increase the fabrication complexity. Although an additional mask is required to define the window 24 in the thin oxide layer 22 as compared with the conventional fabrication process, the fact that the layer 14 is in ohmic contact with the guard ring 8 means that it is no longer necessary to provide a separate contact to the guard ring, and as a result the overall number of masks or process steps used may be similar in both processes.

FIGS. 7 to 10 shows successive steps in the fabrication of an avalanche photodiode used in another embodiment of photodetector circuit in accordance with the invention, the fabrication method being substantially as hereinbefore described in the method illustrated in FIGS. 3 to 6 except that the steps of depositing the further $SiO_2$ insulating layer 10 and forming a window 20 in such a layer are omitted. As in the method of FIGS. 3 to 6, the contact layer 14 forms an ohmic contact over an annular region 18 with the annular guard ring 8. Again a weakly doped p-type implant 7 is optionally provided within the guard ring 8.

Figure 7:
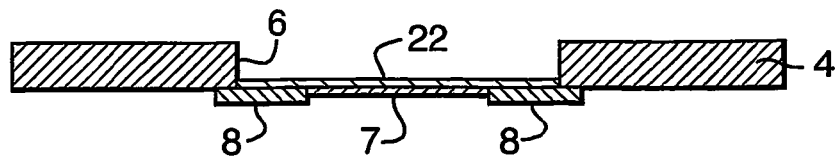
FIGS. 7 to 10 are explanatory sectional views of successive steps in the fabrication of an avalanche photodiode used in another embodiment of the invention.
Figure 8:
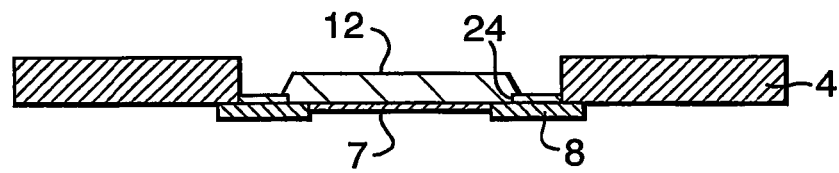

As before, the starting substrate can either be the handle wafer of a p– silicon-on-insulator wafer, or an electrically-isolated p-type well in a bulk Si substrate with an insulating $SiO_2$ layer 4, and a window 6 is produced in the insulating layer 4 by conventional photolithography and etching. A n+ guard ring 8 is created by diffusing donor impurities into the substrate, and a thin insulating $SiO_2$ layer 22, typically of about 25 nm thickness, is thermally grown or deposited so as to cover the exposed surface of the substrate within the window 6, as shown in FIG. 7. Thereafter a window 24 is made in the insulating layer 22 by conventional photolithography and etching, as shown in FIG. 4, and a substantially undoped or lightly doped (uniform or graded) epitaxial Si or SiGe layer 12 is then epitaxially grown selectively on the area of the substrate exposed by the window 24, as shown in FIG. 8.

Figure 9:
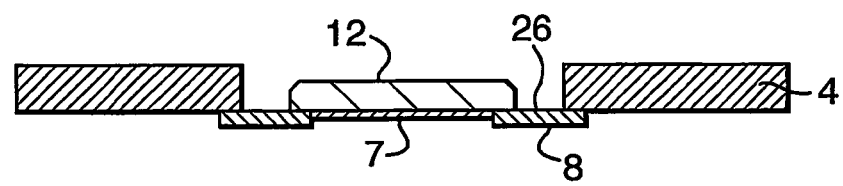
Figure 10:
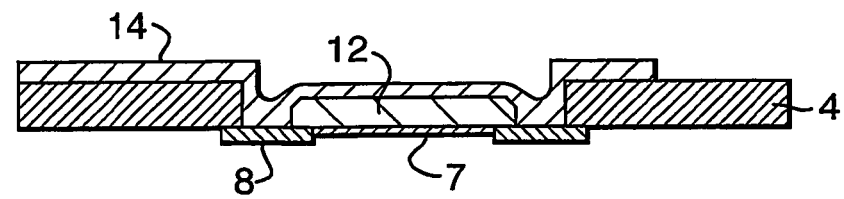

Precisely as in the previously described embodiment the remaining part of the insulating layer 22 is removed by a wet oxide etch (e.g. an HF dip) which exposes an annular portion 26 of the underlying guard ring 8, as shown in FIG. 9. Subsequently a n+ silicon epi-poly layer 14 is deposited on the surface of the device, and forms an ohmic contact with the guard ring 8, as shown in FIG. 10, and simultaneously forms the top contact of the photodiode. Such a method can be used in the fabrication of avalanche photodiodes in systems in which the integration of CMOS circuitry is not required.

Various modifications of the above described photodetector circuits are possible within the scope of the invention. For example the readout circuitry need not be provided in applications in which this is inappropriate. Instead direct wire bonds may be made to the positive and negative terminals of the photodiode. Furthermore an array of similar photodiodes may be provided each within its own window and either with or without associated readout circuitry.

In a further, non-illustrated embodiment the avalanche photodiode and associated readout circuitry are formed on a Si wafer, and the substrate for epitaxy is a doping well in the Si wafer which insulates the photodiode from the readout circuitry. In this case the photodiode is formed in one doping well and the associated readout circuitry is formed in one or more separate doping wells providing significant electrical isolation between the photodiode and the readout circuitry. It will be appreciated that in this case the readout circuitry is not formed on top of the insulating layer, as in the illustrated embodiments, but instead is formed within a separate doping well.

The invention claimed is:

1. A method of making a photodetector circuit incorporating a photodiode, the method including the steps of:
   providing a first electrically insulating layer on a semiconductor substrate;
   forming a first window in the first insulating layer exposing an area of the substrate within the first window;
   forming a guard ring in the exposed area of the substrate within the first window;
   providing a second electrically insulating layer covering the exposed area of the substrate within the first window;
   forming a second window in the second insulating layer exposing a selected area of the substrate within the first window;
   growing on the selected area of the substrate exposed by the second window an epitaxial layer providing an active region of the photodiode detector such that the edges of the epitaxial layer are spaced from the inner periphery of the first window; and
   removing any remaining portion of said second insulating layer.

2. A method according to claim 1, wherein the extent of the windows is such that the guard ring is overlapped by the edges of the epitaxial layer.

3. A method according to claim 1 or 2, wherein the second window is formed in the second insulating layer so as to leave a portion of the second insulating layer within the inner periphery of the first window which ensures, during growth of the epitaxial layer, that the edges of the epitaxial layer are spaced from the inner periphery of the first window.

4. A method according to claim 3, wherein, in said removing step, the remaining annular portion of the second insulating layer is removed by a wet oxide etch.

5. A method according to claim 1, wherein a further electrically insulating layer is provided on the first insulating layer covering the first window, and a further window is formed in the further insulating layer to expose a selected area of the substrate within the first window prior to the forming of the second insulating layer covering the exposed area of the substrate within the first window.

6. A method according to claim 5, wherein the second insulating layer is substantially thinner than the further insulating layer.

7. A method according to claim 5, wherein the second insulating layer has at thickness of 10 nm to 50 nm.

8. A method according to claim 7, wherein the second insulating layer has a thickness of about 25 nm.

9. A method according to claim 1, which includes the step of growing on top of the first-mentioned epitaxial layer a further epitaxial layer having a higher doping level than the first-mentioned epitaxial layer.

10. A method according to claim 9, wherein the further epitaxial layer contacts the substrate so as to be in ohmic contact with the guard ring in the substrate.

11. A method according to claim 1, wherein the photodiode detector is an avalanche photodiode.

12. A method according to claim 1, wherein readout circuitry is formed on the first insulating layer.

13. A method of making a photodetector circuit incorporating a photodiode, the method including the steps of:
providing a first electrically insulating layer on a semiconductor substrate;
forming a first window in the first insulating layer exposing an area of the substrate within the first window;
forming a guard ring in the exposed area of the substrate within the first window;
providing a second electrically insulating layer on said first electrically insulating layer and said first window;
forming a second window in the second electrically insulating layer exposing a portion of said substrate and a portion of said guard ring;
providing a third electrically insulating layer covering the exposed area of the substrate within the second window;
forming a third window in the third insulating layer exposing a selected area of the substrate and guard ring within the second window;
growing on the selected area of the substrate exposed by the third window an epitaxial layer providing an active region of the photodiode detector such that the edges of the epitaxial layer are spaced from the inner periphery of the first window; and
removing any remaining portion of said third insulating layer.

14. A method according to claim 13, wherein the photodiode detector is an avalanche photodiode.

15. A method according to claim 13, wherein readout circuitry is formed on the first insulating layer.

16. A method according to claim 13, wherein the extent of the windows is such tat the guard ring is overlapped by the edges of the epitaxial layer.

17. A method according to claim 13 or 16, wherein the third window is formed in the third insulating layer so as to leave a portion of the third insulating layer within the inner periphery of the first window which ensures, during growth of the epitaxial layer, that the edges of the epitaxial layer are spaced from the inner periphery of the first window.

18. A method according to claim 17, wherein, in said removing step, the remaining annular portion of the third insulating layer is removed by a wet oxide etch.

19. A method according to claim 13, wherein the third insulating layer is substantially thinner than the second insulating layer.

20. A method according to claim 19, wherein the third insulating layer has a thickness of 10 nm to 50 nm.

21. A method according to claim 20, wherein the third insulating layer has a thickness of about 25 nm.

22. A method according to claim 13, which includes the step of growing on top of the first-mentioned epitaxial layer a further epitaxial layer having a higher doping level than the first-mentioned epitaxial layer.

23. A method according to claim 22, wherein the further epitaxial layer contacts the substrate so as to be in ohmic contact with the guard ring in the substrate.

* * * * *